United States Patent [19]

Harajiri et al.

[11] Patent Number: 4,599,246
[45] Date of Patent: Jul. 8, 1986

[54] METHOD OF PRODUCING LIQUID-CRYSTAL DISPLAY DEVICE

[75] Inventors: Toshihiko Harajiri; Shunichi Motte; Masafumi Shinbo, all of Tokyo, Japan

[73] Assignee: Seiko Instruments & Electronics Ltd., Tokyo, Japan

[21] Appl. No.: 665,774

[22] Filed: Oct. 29, 1984

[30] Foreign Application Priority Data

Nov. 7, 1983 [JP] Japan .................. 58-208477

[51] Int. Cl.⁴ .............................................. B05D 5/12
[52] U.S. Cl. ................................. 427/86; 204/192 C; 427/38; 427/57; 427/87; 427/88; 427/89; 427/90; 427/91
[58] Field of Search ...................... 427/38, 57, 86, 87, 427/88, 89, 90, 91; 204/192 C

[56] References Cited

U.S. PATENT DOCUMENTS 4,452,826  6/1984  Shields et al. .................. 427/86 X Primary Examiner—James R. Hoffman
Attorney, Agent, or Firm—Robert E. Burns; Emmanuel J. Lobato; Bruce L. Adams

[57] ABSTRACT

A thin film transistor array for a liquid crystal display device is produced by simultaneously forming gate electrodes and picture element electrodes; forming islands of a layered structure comprised of a gate insulating film, a thin semiconductor film and a light shielding film in a single masking step; and forming the gate, source and drain wiring metals in contact windows by the "lift-off" technique after using a resist film for opening the contact windows. Only three masking steps are required thereby enabling an increase in production yield and a lower production cost as compared to conventional techniques which typically require seven masking steps.

4 Claims, 17 Drawing Figures

METHOD OF PRODUCING LIQUID-CRYSTAL DISPLAY DEVICE

BACKGROUND OF THE INVENTION

This invention relates to a method of producing a liquid-crystal display device in which active elements thereof are arranged in a matrix form.

In accordance with a conventional method of producing a liquid-crystal display device using thin film transistors as active elements, the display device is produced after passing through seven masking steps, as depicted in FIGS. 1a to 1g. First of all, a gate electrode 1 is formed on a substrate using a first mask (FIG. 1a), and a picture element 2 consisting of a transparent conductive film 2 is then patterned using a second mask (FIG. 1b). A gate insulator film 3 is formed over the gate electrode 1 using a third mask (FIG. 1c), and a thin semiconductor film 4 is then formed using a fourth mask so as to cover at least past of the gate electrode 1 and the gate insulator film 3 (FIG. 1d). Source and drain electrodes 5 and 6 are simultaneously patterned using a fifth mask (FIG. 1e), and then an insulator film 7 is patterned over the source and drain electrodes 5 and 6 using a sixth mask so as to open at least an electrode lead-out port (FIG. 1f). Finally, a light-shielding film 8 is patterned using a seventh mask (FIG. 1g). Since the number of masking steps is so large, the production yield is inevitably lowered.

SUMMARY OF THE INVENTION

It is an object of the present invention to reduce the production cost by reducing the number of masking steps.

DETAILED DESCRIPTION OF PREFERRED EMBODIMENTS

Hereinafter, a method of producing a thin film transistor array for a liquid-crystal display device in accordance with a first embodiment of the present invention will be described in detail with reference to FIGS. 2a through 2e.

Figure 1A:
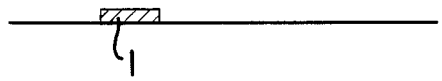
FIGS. 1a through 1g are sections through a liquid-crystal device, showing the steps in a conventional production method.
Figure 1B:
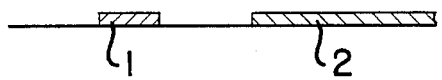
Figure 1C:
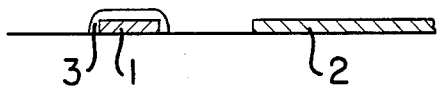
Figure 1D:
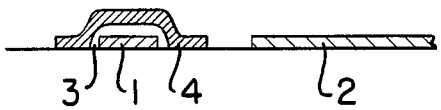
Figure 1E:
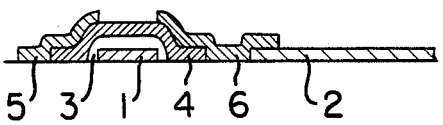
Figure 1F:
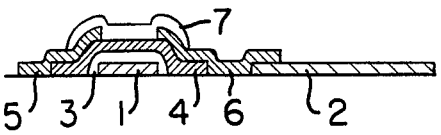
Figure 1G:
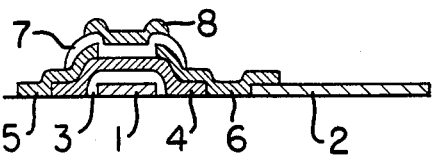
Figure 2A:
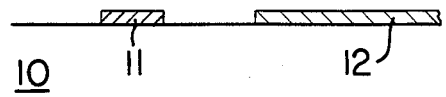
FIGS. 2a through 2e are sections through a liquid-crystal device, showing the steps in the production method in accordance with one embodiment of the present invention.

Reference numeral 10 denotes a substrate made of quartz, glass, or the like. After a transparent conductive film such as a tin oxide film ($SnO_2$) or an indium oxide film ($In_2O_3$) is deposited over the substrate 10 by chemical vapor deposition (CVD) or evaporation, a first masking and etching step is carried out to pattern the film in any desired shape, as shown in FIG. 2a. Reference numerals 11 and 12 each denote portions of the transparent conductive film, 11 denotes that of a gate electrode and 12 that of a picture element electrode. A gate insulator film, a thin semiconductor film and an opaque insulator film are then deposited in sequence by plasma CVD, or the like.

Figure 2B:
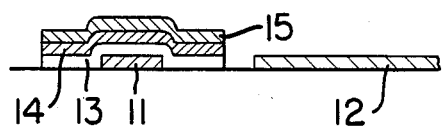

Silicon oxide ($SiO_2$), silicon nitride ($Si_3N_4$) or the like can be used as the gate insulator film, and amorphous silicon (a-Si), polycrystalline silicon (p-Si), CdS, CdSe, Te, PdTe, and the like are known materials for use as the thin semiconductor film. Germanium (Ge) or the like can be used for the opaque insulator film. After the gate insulator film, the thin semiconductor film and the opaque insulator film are patterned by a second masking and etching step while at least part of the gate electrode 11 is covered, a structure such as shown in FIG. 2b is obtained. Reference numeral 13 denotes the gate insulator film, 14 the thin semi-conductor film, and 15 the opaque insulator film.

Figure 2C:
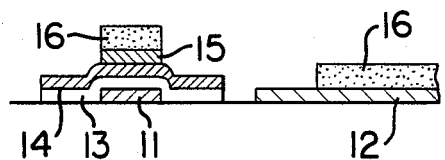

Next, after a resist is opened over the source and drain portions of the thin semiconductor film 14, over a contact portion of the picture element electrode 12, and over an external terminal lead-out portion by a third masking step, the opaque insulator film 15 is etched, as shown in FIG. 2c. Reference numeral 16 denotes the patterned resist. The external terminal lead-out portion comprises a pad through which signals can be applied to a source line and a gate line, and is connected by wire bonding or the like to a driving circuit which outputs the signals.

Figure 2D:
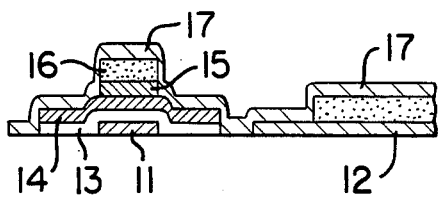

The opaque insulator film 15 is for protecting the thin semiconductor film 14 from exposure to light and is etched by the second masking and etching step, except over the thin semiconductor film 14, and since the opaque insulator film at the source and drain regions in the thin semiconductor film 14 are etched, a desired pattern can be formed. Next, while the resist 16 is still applied, as in FIG. 2c a metal electrode layer 17 is deposited by sputtering or evaporation, as shown in FIG. 2d.

Figure 2E:
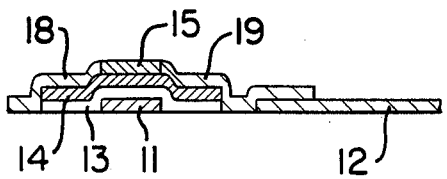

Aluminum or the like is used as the metal electrode layer 17. When the resist 16 is etched, the electrode metal layer 17 over the resist 16 is etched simultaneously. This etching is generally called "lift-off", and is effected by immersing the substrate into an acetone solution to which ultrasonic waves are applied. This step forms the metal electrode metal layer 17 at contact window portions where the resist has been opened by the third masking step, that is, at the source and drain in the thin semiconductor film 14, the contact portion of the picture element electrode 12, and the external terminal lead-out portion. The resist over the other portions is removed, so that the element is left as shown in FIG. 2e, completing the method of producing a liquid-crystal display device in which an active element is used for driving the liquid crystal.

Reference numeral 18 denotes a source electrode, and 19 a drain electrode which connects the drain of the thin semiconductor film 14 to the picture element electrode 12.

Whereas seven masking steps are necessary conventionally, the method of producing a liquid-crystal display device described above reduces the number of masking steps to only three. Accordingly, not only can this reduction of the masking steps reduce the production cost, but the consequent large improvement in the production yield also results in a cost reduction. Since the electrode metal layer 17 is patterned by lift-off after the patterning of the opaque insulator film 15, the thin semiconductor film 14 is completely covered by the opaque insulator film 15 and the electrode metal layer 17, so that all light incident from above is intercepted and there is no deterioration of the thin semiconductor film 14 due to light.

Figure 3A:
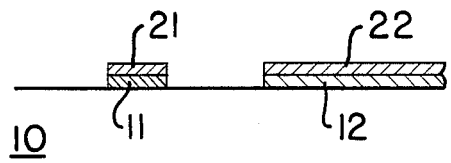
FIGS. 3a through 3c are sections through a liquid-crystal device, showing the steps in the production method in accordance with a second embodiment of the present invention.
Figure 3B:
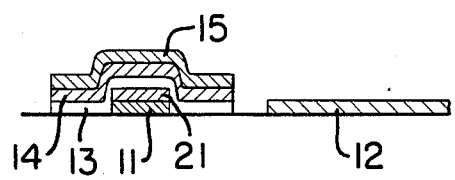
Figure 3C:
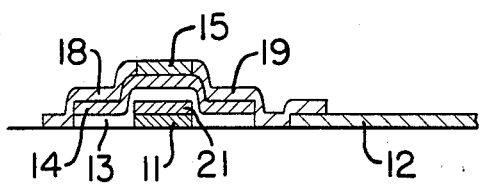

FIGS. 3a through 3c show a method of producing a thin film transistor array for a liquid-crystal display device in accordance with a second embodiment of the present invention. This embodiment is characterized in that a metal gate layer 21 is applied over the gate electrode 11 of the first embodiment.

After a transparent conductive film is deposited on the substrate 10 in the same way as in the first embodiment, a metal gate layer is deposited thereon by sputtering or evaporation. Aluminum, chromium molybdenum, nickel or the like can be used as the metal gate layer. The gate metal layer and the transparent conductive film are then patterned in sequence by the first masking and etching step, to produce the element shown in FIG. 3a. Reference numeral 21 denotes the metal gate layer deposited over the gate electrode 11, and reference numeral 22 denotes the metal layer which is formed simultaneously with the deposition of metal gate layer 21. Thereafter, the gate insulator film 13, the thin semiconductor film 14 and the opaque insulator film 15 are patterned by the same step as in the first embodiment, and the metal gate layer is etched. In this manner, the portion of the metal layer 22 not covered by the gate insulator film 13 is etched, as shown in FIG. 3b. A liquid-crystal display device provided with an active element is formed, as shown in FIG. 3c, by forming the opaque insulator film 15, the source electrode 18 and the drain electrode 19 in the same way as in the first embodiment.

Figure 4:
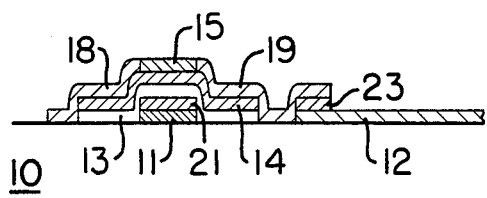
FIG. 4 is also a section through the liquid-crystal device produced in accordance with the second embodiment of the present invention.

When the material of the metal gate layer is different from that of the source and drain electrodes 18 and 19, the metal layer 22 can be etched after the source and drain electrodes 18 and 19 are patterned, as shown in FIG. 4. In this case, a part 23 of the metal layer is left, but this will not raise any problems. The metal layer 21 of the liquid-crystal display device of the structure shown in FIGS. 3c or 4 can intercept the light incident from below, and this element is therefore suitable for a transmission type of liquid-crystal display device using back lighting. In this case as well, the number of masking steps required is only three.

Figure 5:
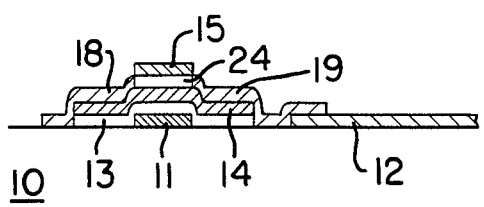
FIG. 5 is a section through a liquid-crystal device produced in accordance with a third embodiment of the present invention.

The device shown in FIG. 5 is produced in accordance with a third embodiment of the present invention in which an insulator layer 24 of $SiO_2$ or $Si_3N_4$ is provided. This is provided when leakage currents from the opaque conductive film 15 are large. The gate insulator film 13, the thin semiconductor film 14, the insulator layer 24, and the opaque conductive film 15 are deposited in sequence and are then patterned in the same way as in the first or second embodiment. The device is completed by etching the insulator 24 after etching the opaque insulator film 15. In this case as well, the number of masking steps required is only three.

As described above, the present invention can reduce the number of masking steps required from the seven of the prior art to three steps, and can therefore greatly reduce the production cost. The present invention can thus provide a reliable method of producing a liquid-crystal display device which is highly resistant to light damage, and has a high reliability, whether the liquid-crystal display device is of a reflection type or a transmission type.

We claim:

1. A method of producing a thin film transistor array for a liquid-crystal display device, comprising the steps of:

depositing a transparent conductive film over a substrate;

forming a picture element electrode and a gate electrode from said transparent conductive film in a first masking step;

depositing in sequence a gate insulator film, a thin semiconductor film and at least one opaque insulator film;

forming selectively said gate insulator film, said thin semiconductor film and said opaque insulator film in a pattern so that at least a portion of said gate electrode is covered, in a second masking step;

opening up a resist over source and drain regions of said thin semiconductor film and the resist over a contact portion of said picture element electrode in a third masking step, and then exposing the source and drain regions of said thin semiconductor film by etching said opaque insulator film; and depositing a metal electrode layer while said resist is still attached, and then removing said resist so as to pattern said metal electrode layer.

2. The method of producing a thin film transistor array for a liquid-crystal display device as defined in claim 1 which further includes the steps of depositing a metal gate layer over said transparent electrode, patterning said metal gate layer and said transparent electrode by said first masking step, and then etching said metal gate layer deposited over said transparent conductive film, other than over at least said gate electrode portion, immediately before said third masking step or after the patterning of said metal electrode layer.

3. The method of producing a thin film transistor array for a liquid-crystal display device as defined in claim 2 which further includes the steps of depositing an inter-layer insulator film over said thin semiconductor film, and patterning said inter-layer insulator film and said opaque insulator film simultaneously.

4. The method of producing a thin film transistor array for a liquid-crystal display device as defined in claim 1 which further includes the steps of depositing an inter-layer insulator film over said thin semiconductor film, and patterning said inter-layer insulator film and said opaque insulator film simultaneously.

* * * * *